(12) United States Patent
Miyata et al.

(10) Patent No.: US 7,271,441 B2
(45) Date of Patent: Sep. 18, 2007

(54) SEMICONDUCTOR DEVICE AND METHOD FOR FABRICATING THE SAME

(75) Inventors: Satoe Miyata, Kyoto (JP); Shuji Mizokuchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 204 days.

(21) Appl. No.: 11/261,927

(22) Filed: Oct. 31, 2005

(65) Prior Publication Data

US 2006/0157780 A1 Jul. 20, 2006

(30) Foreign Application Priority Data

Jan. 19, 2005 (JP) ............................. 2005-011289
Aug. 25, 2005 (JP) ............................. 2005-244255

(51) Int. Cl.
*H01L 29/76* (2006.01)
*H01L 21/336* (2006.01)

(52) U.S. Cl. ...................... 257/330; 257/341; 438/270; 438/279

(58) Field of Classification Search ........ 257/330–332, 257/341; 438/270, 272, 273, 279
See application file for complete search history.

(56) References Cited

U.S. PATENT DOCUMENTS 4,767,722 A 8/1988 Blanchard

2006/0157780 A1 7/2006 Miyata et al. ............... 257/331

FOREIGN PATENT DOCUMENTS

JP 2662217 6/1997

*Primary Examiner*—Mark V. Prenty
(74) *Attorney, Agent, or Firm*—McDermott Will & Emery LLP (57) ABSTRACT

The semiconductor device includes a first semiconductor region of a first conductivity type partially extending to a top face of a semiconductor substrate; a second semiconductor region of a second conductivity type formed on the first semiconductor region; a third semiconductor region of the first conductivity type formed on the second semiconductor region; a fourth semiconductor region of the second conductivity type formed on the second semiconductor region and adjacent to the third semiconductor region; a trench penetrating through the second semiconductor region and the third semiconductor region; a gate insulating film formed on an inner wall of the trench; and a gate electrode formed on the gate insulating film within the trench. The semiconductor device further includes a fifth semiconductor region of the second conductivity type formed on the second semiconductor region to be sandwiched between the fourth semiconductor region and a portion of the first semiconductor region positioned on a side of the fourth semiconductor region. An impurity concentration in the fifth semiconductor region is higher than an impurity concentration in the second semiconductor region.

16 Claims, 8 Drawing Sheets

SEMICONDUCTOR DEVICE AND METHOD FOR FABRICATING THE SAME

CROSS-REFERENCE TO RELATED APPLICATIONS

This application claims priority under 35 U.S.C. §119 on Patent Application No. 200-011289 filed in Japan on Jan. 19, 2005, the entire contents of which are hereby incorporated by reference. The entire contents of Patent Application No. 2005-244255 filed in Japan on Aug. 25, 2005 are also incorporated by reference.

BACKGROUND OF THE INVENTION

The present invention relates to a semiconductor device having a trench MIS (Metal-Insulator-Semiconductor) gate structure and a method for fabricating the same.

A trench gate structure formed by filling a gate electrode in a trench formed in a semiconductor substrate is conventionally applied to semiconductor devices such as an IGBT (Insulated Gate Bipolar Transistor) and a MISFET (Field Effect Transistor), and is advantageous for power supply and the like in particular. For example, an IGBT having a trench gate structure has both a high input impedance characteristic of a MISFET and a low saturated voltage characteristic of a bipolar transistor, and is widely used in an uninterruptible power supply and various types of motor driving devices.

Figure 10:
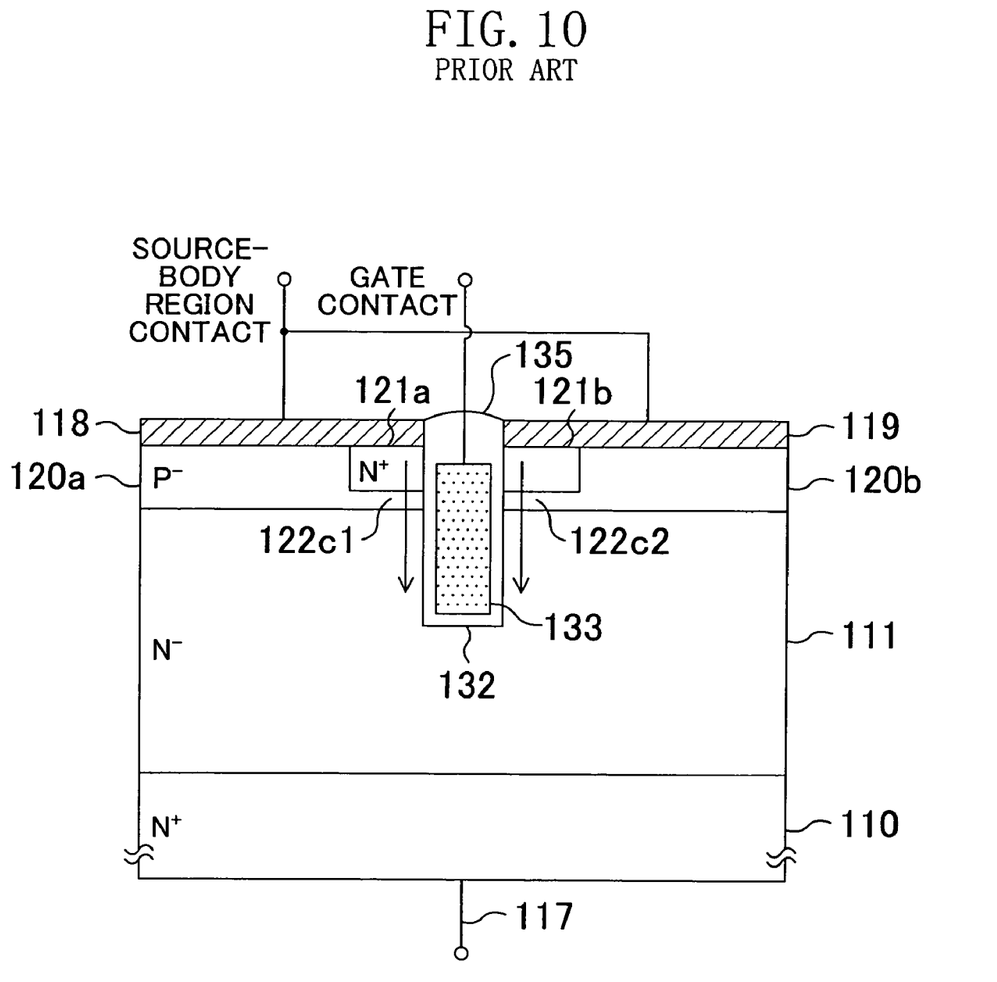
FIG. 10 is a cross-sectional view of a semiconductor device having a conventional trench MIS gate structure.

FIG. 10 is a cross-sectional view of a semiconductor device having a conventional trench MIS gate structure disclosed in Japanese Patent No. 2662217. The conventional semiconductor device of FIG. 10 has a flat surface in all masking steps while a vertical contact to a gate electrode can be formed. Specifically, on a multilayered structure of a high concentration drain region 110 and a low concentration drain region 111 of a first conductivity type (N-type), body regions 120a and 120b of a second conductivity type (P-type) spaced from each other by an upward opening trench are formed. The high concentration drain region 110 is connected to a drain contact 117. Also, source regions 121a and 121b of the first conductivity type are formed in portions of the body regions 120a and 120b in the vicinity of the upward opening trench. Metal contacts 118 and 119 for attaining contact with the source regions and the body regions are formed on the source regions 121a and 121b and the body regions 120a and 120b, respectively.

The upward opening trench extends into the low concentration drain region 111 through portions between the source regions 121a and 121b and between the body regions 120a and 120b. A gate insulating film 132 is formed on the inner wall of the upward opening trench, and a gate electrode (vertical gate) 133 is filled in the upward opening trench excluding an upper portion thereof with the gate insulating film 132 sandwiched therebetween. The upper face of the gate electrode 133 is placed at a level within the heights of the source regions 121a and 121b. Also, an insulating film 135 is filled in the upper portion of the upward opening trench on the upper face of the gate electrode 133, and the upper face of the insulating film 135 is planarized to be at the same level as the upper faces of the metal contacts 118 and 119.

Although not shown in the drawing, an insulating film is formed on the structure shown in FIG. 10, so as to give a transistor with a flat face. The semiconductor device (MISFET) having the trench MIS gate structure as described above can be easily fabricated. In addition, vertically extending channel regions 122c1 and 122c2 are formed in portions of the body regions 120a and 120b in the vicinity of the gate insulating film 132 on sides of the trench. The channel region 122c1 is sandwiched between the low concentration drain region 111 disposed below and the source region 121a disposed above. The channel region 122c2 is sandwiched between the low concentration drain region 111 disposed below and the source region 121b disposed above. Since the channel regions 122c1 and 122c2 vertically extend in this manner, carriers are allowed to continuously pass vertically in the downward direction, and therefore, the on resistance can be reduced.

SUMMARY OF THE INVENTION

In the conventional semiconductor device, however, when integrated circuits are further refined and a distance between trenches filled with gate electrodes is smaller, a large potential difference is caused between the body regions 120a and 120b and the drain contact 117, and therefore, a depletion layer extending from the drain side spreads to a low concentration region in the body regions 120a and 120b. As a result, it is apprehended that the drain and a substrate contact (that is, a contact between the source and the body region) are conducted to each other.

In consideration of the conventional disadvantage, an object of the invention is providing a highly reliable semiconductor device in which the conduction between a drain and a substrate contact can be prevented, and a method for fabricating the same.

In order to achieve the object, the semiconductor device of this invention includes a first semiconductor region of a first conductivity type that is formed in a lower portion of a semiconductor substrate and a portion of which extends to a top face of the semiconductor substrate; a second semiconductor region of a second conductivity type formed on the first semiconductor region in the semiconductor substrate; a third semiconductor region of the first conductivity type formed on the second semiconductor region in the semiconductor substrate; a fourth semiconductor region of the second conductivity type formed on the second semiconductor region and adjacent to the third semiconductor region in the semiconductor substrate; a trench penetrating through the second semiconductor region and the third semiconductor region and reaching the first semiconductor region; a gate insulating film formed on an inner wall of the trench; a gate electrode formed on the gate insulating film within the trench; and a fifth semiconductor region of the second conductivity type formed on the second semiconductor region in a portion of the semiconductor substrate sandwiched between the fourth semiconductor region and a portion of the first semiconductor region positioned on a side of the fourth semiconductor region, and an upper face of the portion of the first semiconductor region extending to the top face of the semiconductor substrate, an upper face of the third semiconductor region, an upper face of the fourth semiconductor region and an upper face of the fifth semiconductor region correspond to the top face of the semiconductor substrate, and an impurity concentration in the fifth semiconductor region is higher than an impurity concentration in the second semiconductor region.

In the semiconductor device of the invention, the fifth semiconductor region of the second conductivity type (corresponding to a part of a substrate region) including an impurity in a higher concentration than in the second semiconductor region of the second conductivity type corresponding to a substrate main region is disposed between the fourth semiconductor region of the second conductivity type (corresponding to a part of the substrate region) and an upper face portion of the first semiconductor region of the first conductivity type (i.e., a drain region). Therefore, spread of a depletion layer extending from the drain region can be suppressed. Accordingly, a leakage current (conduction) between the drain and a substrate contact can be prevented.

In the semiconductor device of the invention, the fifth semiconductor region may be in contact with the fourth semiconductor region. In this case, the fifth semiconductor region may be in contact with the portion of the first semiconductor region extending to the top face of the semiconductor substrate.

In the semiconductor device of the invention, an impurity concentration in the fourth semiconductor region is preferably higher than the impurity concentration in the second semiconductor region.

Thus, the resistance of the substrate contact can be reduced.

In the semiconductor device of the invention, the impurity concentration in the fifth semiconductor region is preferably lower than an impurity concentration in the fourth semiconductor region.

Thus, degradation in voltage resistance between the drain and the substrate contact can be prevented.

In the semiconductor device of the invention, an upper face of the gate electrode is preferably placed at a level between an upper face and a lower face of the third semiconductor region.

Thus, a contact can be formed on a side face of a source region positioned in an upper portion of the trench, and therefore, the resistance of the source contact can be reduced.

The semiconductor device of the invention preferably further includes an insulating film for covering an upper face of the gate electrode within the trench, and an upper face of the insulating film is preferably placed at a level between an upper face and a lower face of the third semiconductor region.

Thus, a source electrode can be formed on the gate electrode with the insulating film sandwiched therebetween, and hence, the source regions formed on both sides of the trench can be easily connected to each other through the source electrode.

In the semiconductor device of the invention, the first semiconductor region preferably includes a sixth semiconductor region of the first conductivity type including an impurity in a relatively high concentration and a seventh semiconductor region of the first conductivity type disposed on the sixth semiconductor region and including an impurity in a relatively low concentration.

Thus, the second semiconductor region working as a channel region is in contact with the seventh semiconductor region of the first conductivity type having a relatively low impurity concentration and is away from the sixth semiconductor region of the first conductivity type having a relatively high impurity concentration, and therefore, an on current can be reduced.

The method for fabricating a semiconductor device of this invention includes the steps of (a) forming a first semiconductor region of a first conductivity type in a semiconductor substrate; (b) forming a second semiconductor region of a second conductivity type in the first semiconductor region; (c) forming, in an upper portion of the second semiconductor region, a third semiconductor region of the first conductivity type, a fourth semiconductor region of the second conductivity type adjacent to the third semiconductor region and a fifth semiconductor region of the second conductivity type sandwiched between the fourth semiconductor region and a portion of the first semiconductor region positioned on a side of the fourth semiconductor region; (d) forming a trench reaching a given portion of the first semiconductor region in the semiconductor substrate; (e) forming a gate insulating film on an inner wall of the trench; and (f) forming a gate electrode on the gate insulating film within the trench, and an impurity concentration in the fifth semiconductor region is made higher than an impurity concentration in the second semiconductor region in the step (c).

Specifically, the method for fabricating a semiconductor device of this invention is a method for fabricating the aforementioned semiconductor device of the invention, and therefore, the aforementioned effects of the semiconductor device of the invention can be attained.

In the method for fabricating a semiconductor device of the invention, an impurity concentration in the fourth semiconductor region is preferably made higher than the impurity concentration in the second semiconductor region in the step (c).

Thus, the resistance of the substrate contact can be reduced.

In the method for fabricating a semiconductor device of the invention, the impurity concentration in the fifth semiconductor region is preferably made lower than an impurity concentration in the fourth semiconductor region in the step (c).

Thus, the degradation in the voltage resistance between the drain and the substrate contact can be prevented.

In the method for fabricating a semiconductor device of the invention, the gate electrode is preferably formed to have an upper face thereof disposed between an upper face and a lower face of the third semiconductor region in the step (f).

Thus, a contact can be formed on a side face of a source region positioned in an upper portion of the trench, and therefore, the resistance of the source contact can be reduced.

In the method for fabricating a semiconductor device of the invention, the second semiconductor region and the fifth semiconductor region are preferably formed after the step (e).

Thus, excessive drawing of a second conductivity type impurity into an insulating film derived from gate insulating film formation (such as oxidation) can be prevented. Accordingly, the impurity concentration in the substrate region working as the channel region (i.e., the second semiconductor region) can be easily controlled, so as to attain a desired threshold voltage Vt.

The method for fabricating a semiconductor device the invention preferably further includes, between the step (d) and the step (e), a step of forming an oxide film by sacrificially oxidizing the inner wall of the trench and removing the oxide film.

Thus, the inner wall of the trench can be made flat. Also, in the case where the channel region of the second semiconductor region is formed after the sacrificial oxidation of the inner wall of the trench, the excessive drawing of an impurity included in the second semiconductor region into the oxide film derived from the sacrificial oxidation can be prevented. Accordingly, the impurity concentration in the channel region can be easily controlled, so as to definitely attain a desired threshold voltage Vt.

In the method for fabricating a semiconductor device of the invention, the fifth semiconductor region is preferably formed after the step (f).

Thus, the fifth semiconductor region can be formed with the gate insulating film within the trench covering with the gate electrode, and therefore, the fifth semiconductor region can be formed without damaging the gate insulating film.

In the method for fabricating a semiconductor device of the invention, the step (f) preferably includes a sub-step (f1) of filling the trench with a conducting film and a sub-step (f2) of forming the gate electrode by etching the conducting film, and the fifth semiconductor region is preferably formed by introducing an impurity of the second conductivity type into the semiconductor substrate through the conducting film by ion implantation between the sub-step (f1) and the sub-step (f2).

Thus, the excessive drawing of the second conductivity type impurity into the insulating film derived from the gate insulating film formation (such as the oxidation) can be prevented while preventing degradation of film quality of the gate insulating film otherwise caused in the ion implantation.

As described so far, according to the present invention, the spread of a depletion layer extending from the drain region is suppressed, so that a leakage current (conduction) between the drain and the substrate contact can be prevented. Accordingly, the reliability of the semiconductor device can be improved.

Also, the present invention is applicable to any of semiconductor devices having a trench MIS gate structure with a high breakdown voltage and used for power supply in particular, such as a MISFET and an IGBT.

BRIEF DESCRIPTION OF THE DRAWINGS

FIGS. 4A, 4B, 4C, 4D, 4E and 4F are cross-sectional views for showing procedures in a method for fabricating the semiconductor device of the embodiment of the invention, and specifically, FIGS. 4A, 4C and 4E are cross-sectional views thereof taken from the front side of FIG. 1A and FIGS. 4B, 4D and 4F are cross-sectional views thereof taken from the right side of FIG. 1A.

FIGS. 5A, 5B, 5C, 5D, 5E and 5F are cross-sectional views for showing other procedures in a method for fabricating the semiconductor device of the embodiment of the invention, and specifically, FIGS. 5A, 5C and 5E are cross-sectional views thereof taken from the front side of FIG. 1A and FIGS. 5B, 5D and 5F are cross-sectional views thereof taken from the right side of FIG. 1A.

FIGS. 6A, 6B, 6C, 6D, 6E and 6F are cross-sectional views for showing other procedures in a method for fabricating the semiconductor device of the embodiment of the invention, and specifically, FIGS. 6A, 6C and 6E are cross-sectional views thereof taken from the front side of FIG. 1A and FIGS. 6B, 6D and 6F are cross-sectional views thereof taken from the right side of FIG. 1A.

FIGS. 7A, 7B, 7C, and 7D are cross-sectional views for showing other procedures in a method for fabricating the semiconductor device of the embodiment of the invention, and specifically, FIGS. 7A and 7C are cross-sectional views thereof taken from the front side of FIG. 1A and FIGS. 7B and 7D are cross-sectional views thereof taken from the right side of FIG. 1A.

FIGS. 8A and 8B are diagrams of a variation of the semiconductor device according to the embodiment of the invention, and specifically, FIG. 8A shows a modified cross-sectional structure taken from the front side of FIG. 1A and FIG. 8B shows a modified cross-sectional structure taken from the right side of FIG. 1A.

FIGS. 9A and 9B are diagrams of a variation of the semiconductor device according to the embodiment of the invention, and specifically, FIG. 9A shows a modified cross-sectional structure taken from the front side of FIG. 1A and FIG. 9B shows a modified cross-sectional structure taken from the right side of FIG. 1A.

DETAILED DESCRIPTION OF THE INVENTION

Now, a preferred embodiment of the semiconductor device and the fabrication method for the same according to the present invention will be described with reference to the accompanying drawings. Although a MISFET having a vertical trench gate structure is exemplified in each embodiment described below, this invention is applicable to any of general semiconductor devices having trench MIS gate structures such as a vertical trench IGBT, a vertical MISFET and a horizontal trench MISFET. Also, although a first conductivity type and a second conductivity type are described respectively as an N-type and a P-type in the following description, the first conductivity type and the second conductivity type may be respectively a P-type and an N-type.

Embodiment

—Structure of Semiconductor Device—

Figure 1:
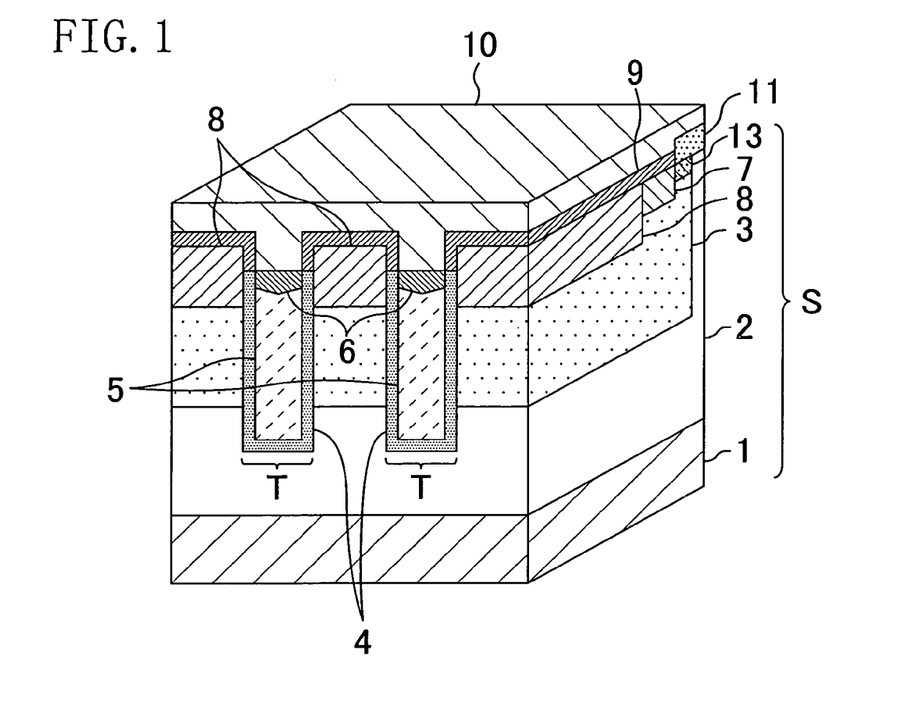
FIG. 1 is a perspective view of a semiconductor device having a trench gate structure according to an embodiment of the invention.
Figure 2A:
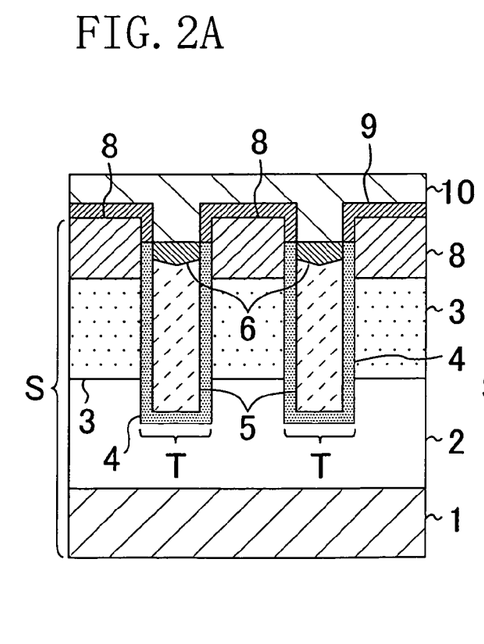
FIG. 2A is a cross-sectional view of the semiconductor device of FIG. 1 taken from the front side of FIG. 1
Figure 2B:
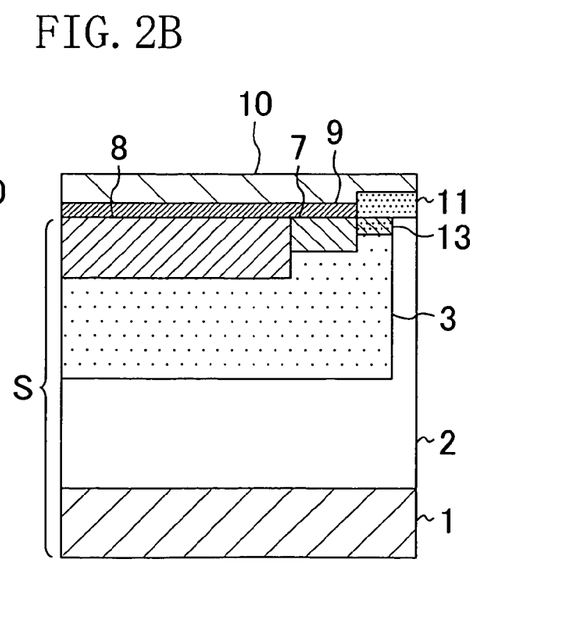
FIG. 2B is a cross-sectional view thereof taken from the right side of FIG. 1.

FIG. 1 is a perspective view of a semiconductor device having a trench gate structure according to an embodiment of the invention, FIG. 2A is a cross-sectional view thereof taken from the front side of FIG. 1 and FIG. 2B is a cross-sectional view thereof taken from the right side of FIG. 1. In FIGS. 1, 2A and 2B, a barrier metal layer provided below a contact electrode 10 is omitted so that the structure can be clearly understood.

As shown in FIG. 1, the semiconductor device of this embodiment includes a high concentration N-type drain region 1 formed at least in a region in the vicinity of the back surface of a semiconductor substrate S of silicon, a low concentration N-type drain region 2 formed on the high concentration N-type drain region 1 in the semiconductor substrate S and partially reaching the top face of the semiconductor substrate S, a P-type substrate region 3 provided on the low concentration N-type drain region 2 in the semiconductor substrate S, a high concentration N-type source region 8 selectively provided on the P-type substrate region 3 in the semiconductor substrate S, a high concentration P-type substrate region 7 selectively provided on the P-type substrate region 3 to be adjacent to the high concentration N-type source region 8 in the semiconductor substrate S and an intermediate concentration P-type substrate region 13 selectively provided on the P-type substrate region 3 to be sandwiched between the high concentration P-type substrate region 7 and an upper face portion of the low concentration N-type drain region 2 in the semiconductor substrate S. In other words, the intermediate concentration P-type substrate region 13 is formed on the P-type substrate region 3 to be away from the high concentration N-type source region 8 with the high concentration P-type substrate region 7 sandwiched therebetween. In this case, the semiconductor substrate S is composed of, for example, a silicon substrate in which the high concentration N-type drain region 1 is formed and a silicon epitaxial layer formed on the silicon substrate, and the silicon epitaxial layer corresponds to the low concentration N-type drain region 2 in this embodiment.

The concentration of a P-type impurity in the high concentration P-type substrate region 7 is higher than that in the P-type substrate region 3. The concentration of the P-type impurity in the intermediate concentration P-type substrate region 13 is higher than that in the P-type substrate region 3 and lower than that in the high concentration P-type substrate region 7. Also, the high concentration N-type source region 8, the high concentration P-type substrate region 7 and the intermediate concentration P-type substrate region 13 are formed so as to reach the top face of the semiconductor substrate S.

Furthermore, a plurality of trenches T that penetrate through the high concentration N-type source region 8 and the P-type substrate region 3 and reach the low concentration N-type drain region 2 are formed in the semiconductor substrate S in parallel to one another. A gate insulating film 4 is formed on the inner wall of each trench T excluding an upper portion thereof, and a gate electrode 5 is filled in the trench T excluding the upper portion thereof with the gate insulating film 4 sandwiched therebetween. Also, a buried insulating film 6 is formed on the gate electrode 5 within each trench T. At this point, the upper face of the gate electrode 5 is placed at a level within the height of the high concentration N-type source region 8 (namely, between the upper face and the lower face of the high concentration N-type source region 8). Furthermore, the upper face of the buried insulating film 6 is also placed at a level within the height of the high concentration N-type source region 8 (namely, between the upper face and the lower face of the high concentration N-type source region 8). Accordingly, the thickness of the buried insulating film 6 is smaller than the height of the high concentration N-type source region 8.

Furthermore, a silicide layer 9 is formed on the high concentration N-type source region 8 and the high concentration P-type substrate region 7 to be in contact with their upper faces. The silicide layer 9 is formed to be in contact with the upper end of the gate insulating film 4 along the upper wall of each trench T.

Moreover, a protection insulating film 11 of, for example, an oxide film is formed on the intermediate concentration P-type substrate region 13 and the upper face portion of the low concentration N-type drain region 2.

A contact electrode 10 of, for example, an Al layer is formed on the silicide layer 9, the protection insulating film 11 and the buried insulating film 6 within the trench T. The contact electrode 10 is electrically connected to the high concentration N-type source region 8 and the high concentration P-type substrate region 7 through the silicide layer 9.

Although not shown in FIG. 1, a barrier metal layer may be formed below the contact electrode 10 and on the silicide layer 9, the protection insulating film 11 and the buried insulating film 6.

Figure 3:
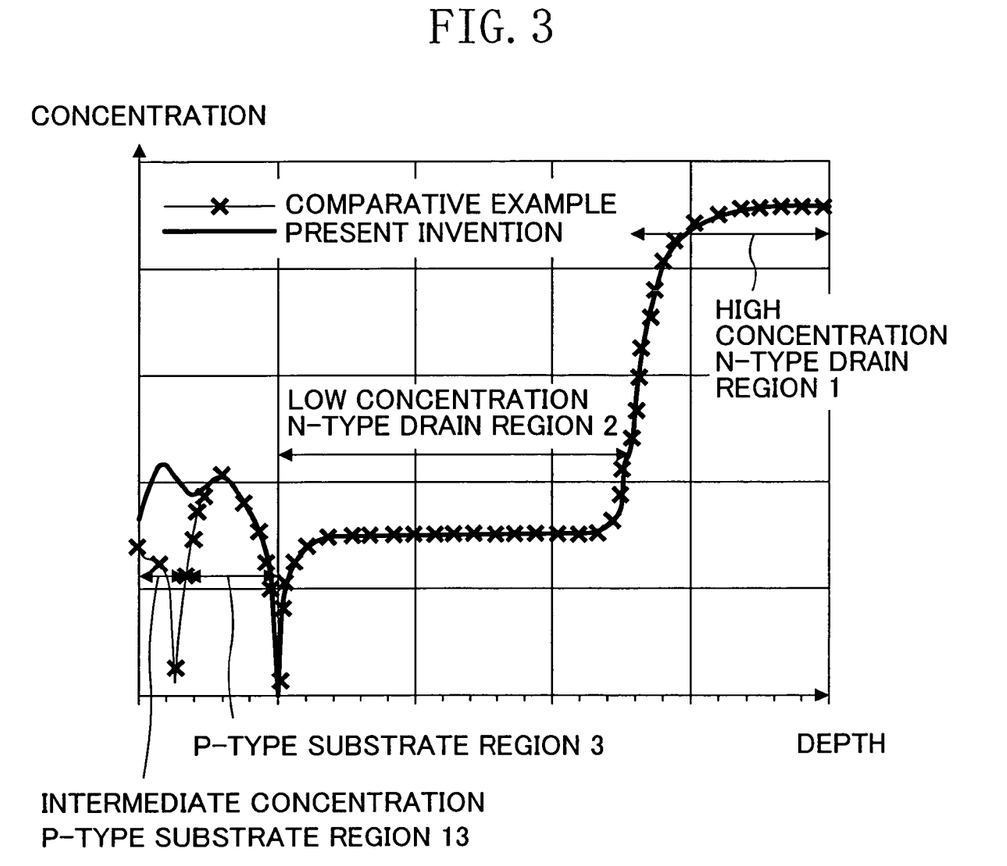
FIG. 3 is a diagram of a Net impurity concentration distribution along the depth direction in the semiconductor device having the trench gate structure according to the embodiment of the invention.

FIG. 3 shows a Net impurity concentration distribution along the depth direction in a portion of the semiconductor substrate S where the intermediate concentration P-type substrate region 13 is formed as a characteristic of this invention. Herein, the Net impurity concentration distribution means the following: When a P-type impurity and an N-type impurity are present in one region, a relatively low concentration of an impurity of a first conductivity type (for example, the N-type impurity) is subtracted from a relatively high concentration of an impurity of a second conductivity type (for example, the P-type impurity), so as to obtain the resultant impurity concentration of the second conductivity type (for example, the P-type impurity) as the Net impurity concentration. It is noted that FIG. 3 also shows a Net impurity concentration distribution along the depth direction obtained when the intermediate concentration P-type substrate region 13 is not formed (namely, when the P-type substrate region 3 is present instead of the intermediate concentration P-type substrate region 13) as a comparative example.

As shown in FIG. 3, in the Net impurity concentration distribution of the comparative example, the concentration of the P-type impurity is abruptly lowered in a portion in the vicinity of the top face of the semiconductor substrate S, and as a result, this portion in the vicinity of the top face may be inverted into an N-type region in an extreme case. On the contrary, in the Net impurity concentration distribution of this embodiment, since the intermediate concentration P-type substrate region 13 is formed, the lowering of the P-type impurity concentration in the vicinity of the top face of the semiconductor substrate S is suppressed and a peak concentration corresponding to the intermediate concentration P-type substrate region 13 is present in the vicinity of the top face of the semiconductor substrate S.

—Fabrication Procedures—

FIGS. 4A through 4F, 5A through 5F, 6A through 6F and 7A through 7D are cross-sectional views for showing procedures in a method for fabricating the semiconductor device of this embodiment of the invention. In particular, FIGS. 4A, 4C, 4E, 5A, 5C, 5E, 6A, 6C, 6E, 7A and 7C show cross-sectional structures taken from the front side of FIG. 1A, and FIGS. 4B, 4D, 4F, 5B, 5D, 5F, 6B, 6D, 6F, 7B and 7D show cross-sectional structures taken from the right side of FIG. 1A.

Figure 4A:
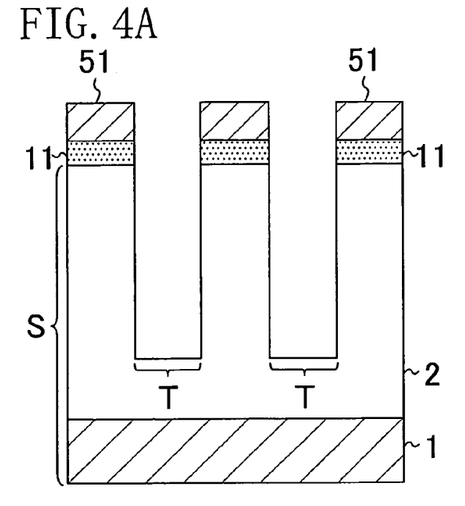
Figure 4B:
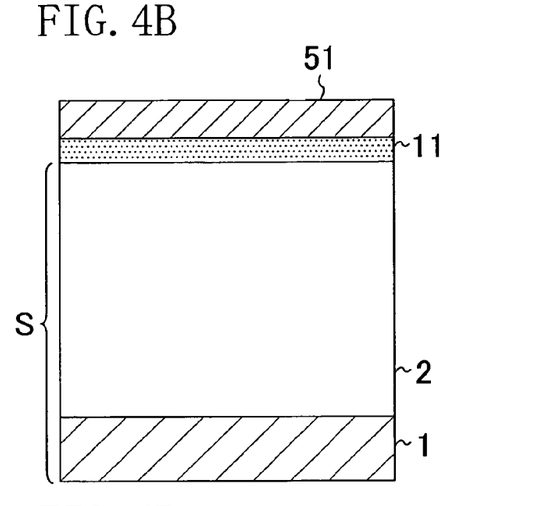

First, as shown in FIGS. 4A and 4B, a high concentration N-type drain region 1 (having a thickness of, for example, 500 μm) including an N-type impurity in a concentration of, for example, approximately $3 \times 10^{19}$ atoms/cm$^3$ and a low concentration N-type drain region 2 (having a thickness of, for example, 3 through 5 μm) including the N-type impurity in a concentration of, for example, approximately $3 \times 10^{16}$ atoms/cm$^3$ are successively formed in a semiconductor substrate S from its back surface side. The semiconductor substrate S may be obtained by, for example, forming the low concentration N-type drain region 2 of a silicon epitaxial layer through epitaxial growth on a silicon substrate in which the high concentration N-type drain region 1 has been formed. Thereafter, after forming a protection insulating film 11 of, for example, an oxide film with a thickness of approximately 250 nm on the semiconductor substrate S, a photoresist mask 51 having an opening in a trench gate forming region is formed on the protection insulating film 11. Then, the protection insulating film 11 and a part of the low concentration N-type drain region 2 of the semiconductor substrate S are selectively etched by dry etching using the photoresist mask 51, thereby forming a trench T (having a width of, for example, approximately 250 nm) reaching a portion of the low concentration N-type drain region 2 at a depth of, for example, approximately 1.3 μm. At this point, the trench may be formed as follows: After etching the protection insulating film 11 by using the photoresist mask 51, the photoresist mask 51 is removed, and thereafter, a part of the low concentration N-type drain region 2 of the semiconductor substrate S is selectively etched by using the protection insulating film 11 where an opening has been formed.

It is noted that the protection insulating film 11 shown in FIG. 4B is used as an implantation protecting film in ion implantation described below and may be removed after the ion implantation or allowed to remain for reducing the number of procedures.

Figure 4C:
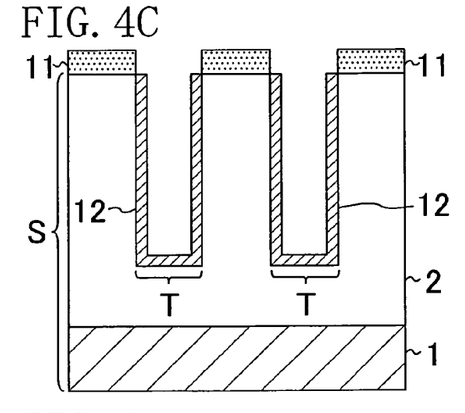
Figure 4D:
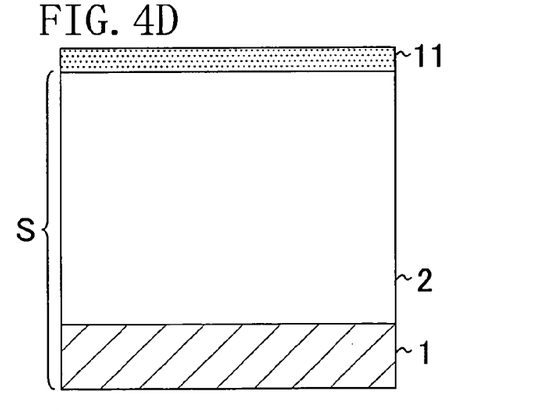

Next, as shown in FIGS. 4C and 4D, a sacrificial oxide film 12 is formed on the inner wall of the trench T. Thereafter, the sacrificial oxide film 12 is removed by wet etching. Thus, the inner wall of the trench T can be made flat.

Figure 4E:
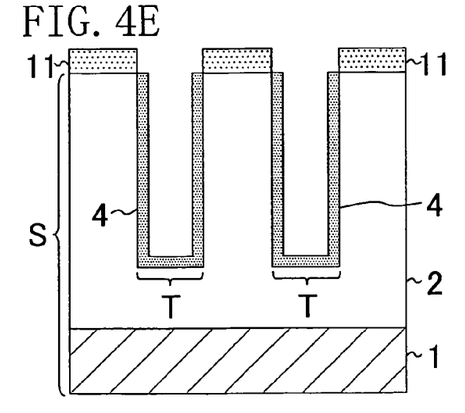
Figure 4F:
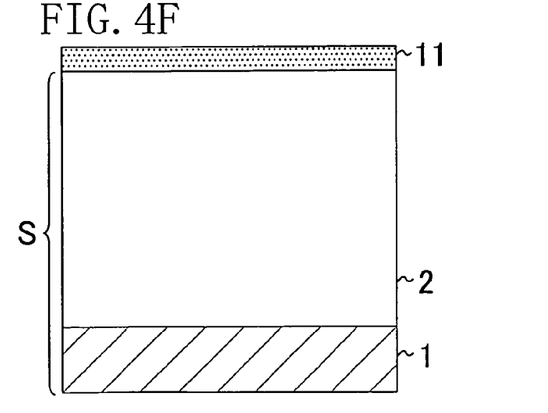

Then, as shown in FIGS. 4E and 4F, a gate insulating film 4 of, for example, silicon oxide with a thickness of, for example, 30 nm is formed on the inner wall of the trench T by thermal oxidation.

Figure 5A:
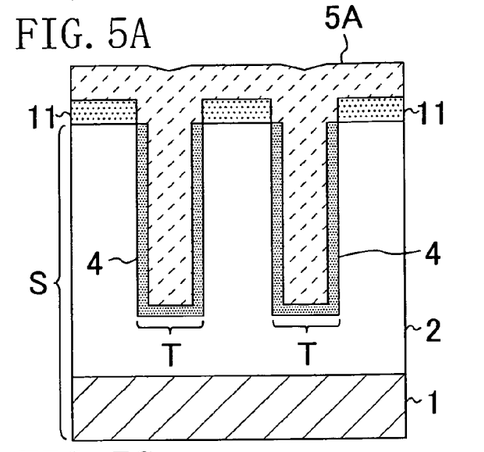
Figure 5B:
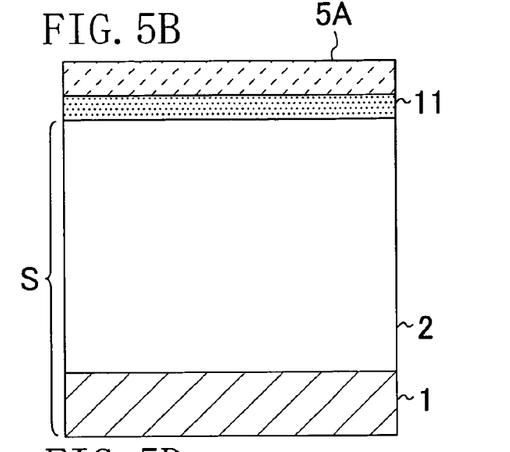

Next, as shown in FIGS. 5A and 5B, a polysilicon film 5A with a thickness of, for example, approximately 400 nm to be made into a gate electrode 5 is deposited on the semiconductor substrate S so as to be filled in the trench T. Thereafter, an N-type impurity is ion implanted into the polysilicon film 5A, and the resultant polysilicon film 5A is subjected to activation annealing (performed at a temperature of, for example, approximately 950° C.) for activating the implanted impurity.

Figure 5C:
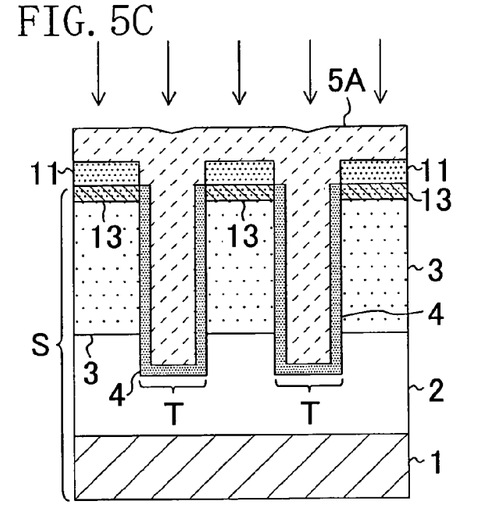
Figure 5D:
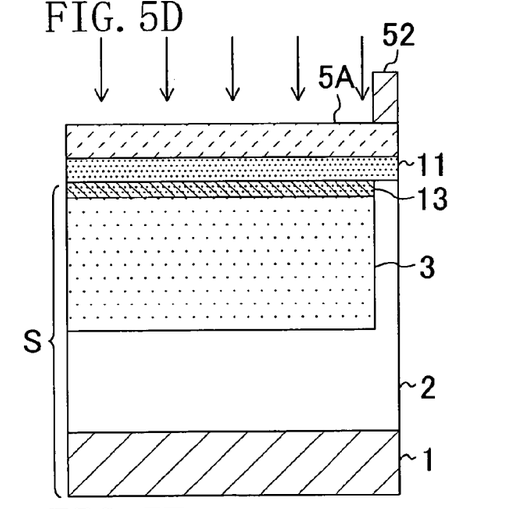

Then, as shown in FIGS. 5C and 5D, a photoresist mask 52 having an opening in a predetermined region including a source region and a high concentration P-type substrate region to be formed later is formed on the polysilicon film 5A. Thereafter, boron, that is, a P-type impurity, is introduced through the polysilicon film 5A and the protection insulating film 11 into an upper portion of the low concentration N-type drain region 2 by the ion implantation using the photoresist mask 52, thereby forming a P-type substrate region 3 having a junction depth of, for example, approximately 1 μm, which is smaller than the depth of the trench T. In this case, the ion implantation is performed at implantation energy of, for example, 400 through 600 keV and a dose of, for example, $6.0 \times 10^{12}$ ions/cm$^2$. Subsequently, a P-type impurity of boron is introduced into an upper portion of the P-type substrate region 3 through the polysilicon film 5A and the protection insulating film 11 by the ion implantation using the photoresist mask 52, thereby forming an intermediate concentration P-type substrate region 13 having a peak concentration depth of the P-type impurity of, for example, approximately 0.2 through 0.3 μm. In this case, the ion implantation is performed at implantation energy of, for example, 200 through 300 keV and a dose of, for example, $5.0 \times 10^{12}$ ions/cm$^2$. It is noted that the peak concentration of the P-type impurity in the intermediate concentration P-type substrate region 13 is higher than that in the P-type substrate region 3 as shown in FIG. 3.

Figure 5E:
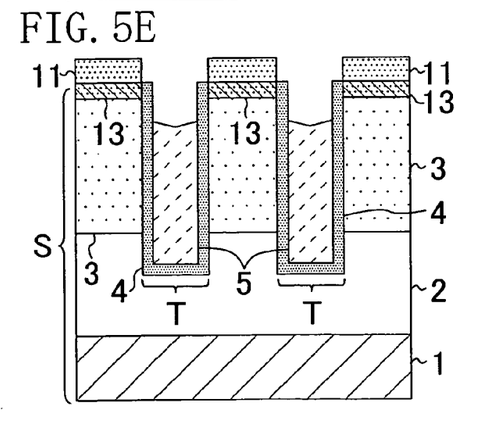
Figure 5F:
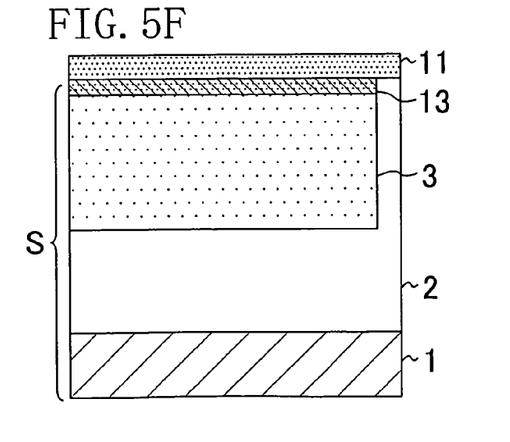

Next, the polysilicon film 5A is etched back as shown in FIGS. 5E and 5F, so as to remove a portion of the polysilicon film 5A disposed on the protection insulating film 11 and to remove a portion of the polysilicon film 5A disposed in an upper portion of the trench T to a given depth. In this manner, the polysilicon film 5A is filled in the trench T excluding the upper portion thereof, and thus, the gate electrode 5 is formed. At this point, a level difference between the top face of the semiconductor substrate S and the upper face of the gate electrode 5 is preferably approximately 200 through 500 nm. Thus, the side face of a source region positioned in the upper portion of the trench T can be exposed, and hence, a source electrode can be formed on the side face of the source region, so as to reduce the resistance of source contact.

Figure 6A:
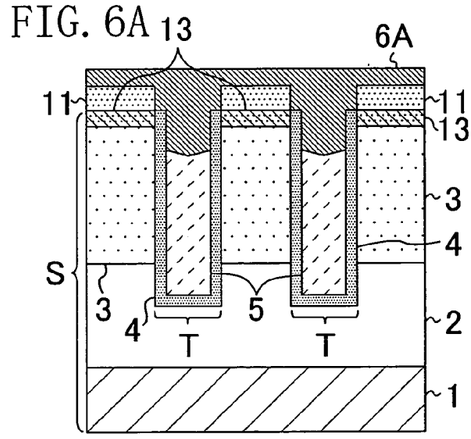
Figure 6B:
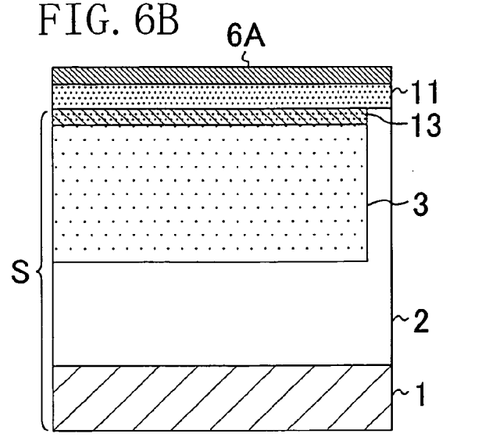

Next, as shown in FIGS. 6A and 6B, after depositing a BPSG (boro-phospho silicate glass) film 6A to be made into a buried insulating film 6 on the semiconductor substrate S so as to fill the trench T, annealing (at a temperature of approximately 850° C.) is performed for making the BPSG film 6A reflow.

Figure 6C:
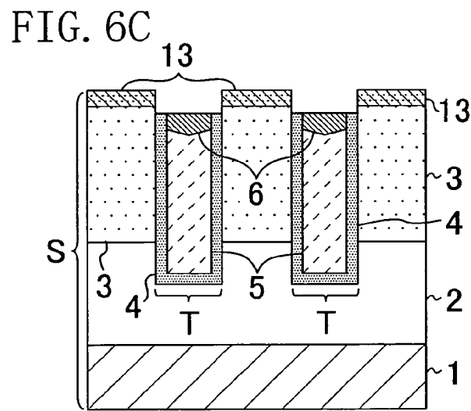
Figure 6D:
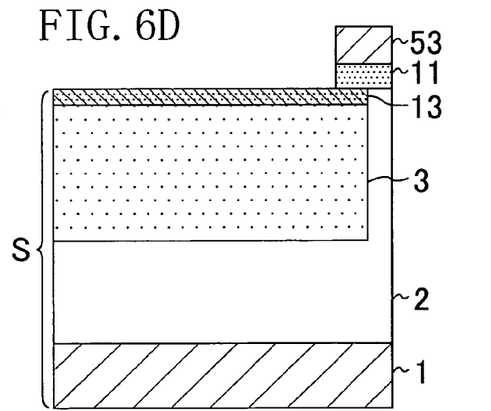

Then, as shown in FIGS. 6C and 6D, the BPSG film 6A is etched back so as to expose the upper face of the protection insulating film 11. At this point, the upper face of the BPSG film 6A remaining within the trench T is planarized to be at substantially the same level as the upper face of the protection insulating film 11. Thereafter, a photoresist mask 53 having an opening in a trench gate structure MIS transistor forming region is formed on the protection insulating film 11. At this point, the photoresist mask 53 is formed so as to overlap an end portion of the intermediate concentration P-type substrate region 13. Then, the protection insulating film 11 and the BPSG film 6A remaining within the trench T are etched back by using the photoresist mask 53, so as to expose the top face of the semiconductor substrate S (namely, the upper face of the intermediate concentration P-type substrate region 13). Furthermore, an upper portion of the BPSG film 6A remaining within the trench T is removed, so that the upper face of the resultant BPSG film 6A can be positioned at a given depth from the top face of the semiconductor substrate S. In this manner, the buried insulating film 6 covering the upper face of the gate electrode 5 within the trench T is formed. At this point, a level difference from the top face of the semiconductor substrate S to the upper face of the buried insulating film 6 is preferably approximately 50 through 350 nm. Although the photoresist mask 53 is formed after etching back the BPSG film 6A formed on the protection insulating film 11 in this embodiment, the photoresist mask 53 may be formed on the BPSG film 6A before etching back the BPSG film 6A and the BPSG film 6A and the protection insulating film 11 may be etched back thereafter.

Figure 6E:
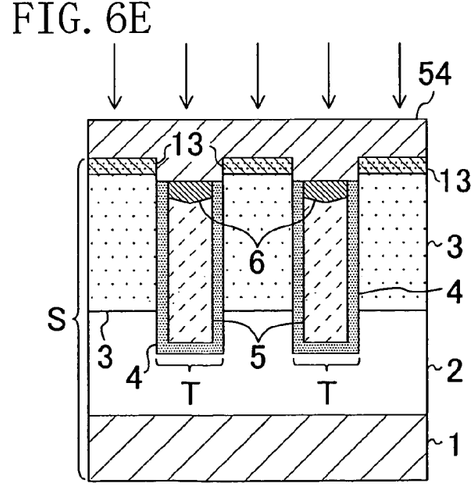
Figure 6F:
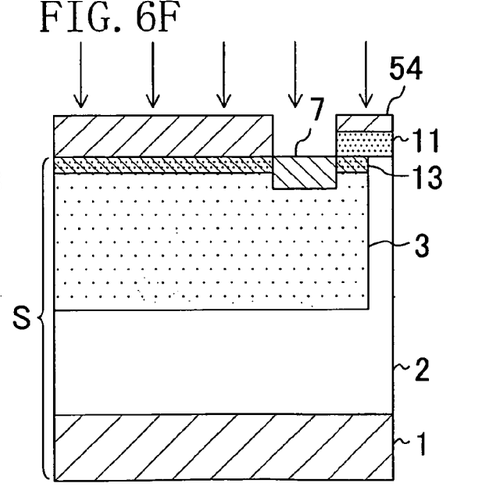

Next, a photoresist mask 54 having an opening in a predetermined region for forming a high concentration P-type substrate region is formed on the semiconductor substrate S as shown in FIGS. 6E and 6F. Then, a P-type impurity is selectively introduced into a part of a surface portion of the P-type substrate region 3 including the intermediate concentration P-type substrate region 13 by the ion implantation using the photoresist mask 54, thereby forming a high concentration P-type substrate region 7. At this point, the junction depth of the high concentration P-type substrate region 7 is larger than that of the intermediate concentration P-type substrate region 13. Also, a peak concentration of the P-type impurity in the high concentration P-type substrate region 7 is higher than that in the P-type substrate region 3. Furthermore, a peak concentration of the P-type impurity in the intermediate concentration P-type substrate region 13 is higher than that in the P-type substrate region 3 and lower than that in the high concentration P-type substrate region 7.

Figure 7A:
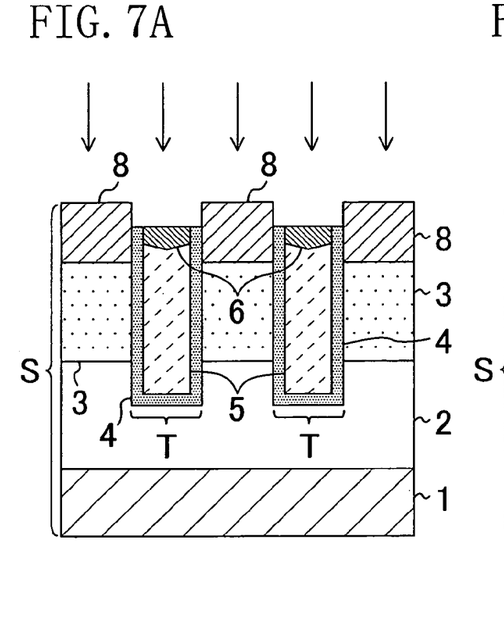
Figure 7B:
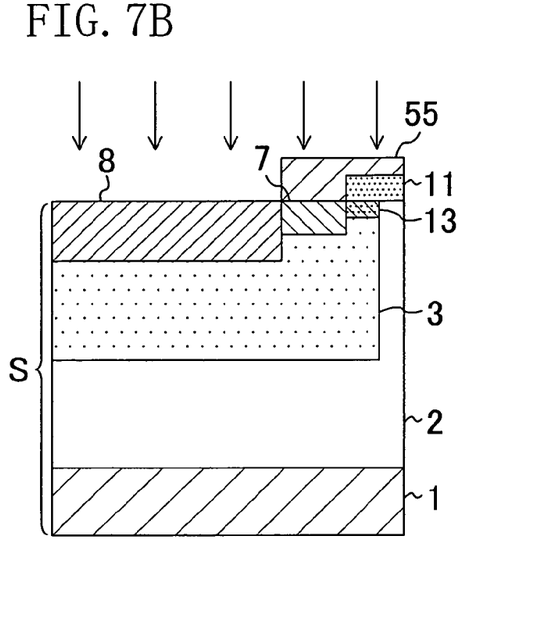

Next, as shown in FIGS. 7A and 7B, a photoresist mask 55 having an opening in a region for forming a source region and covering the high concentration P-type substrate region 7 and the protection insulating film 11 is formed on the semiconductor substrate S. Thereafter, an N-type impurity (such as arsenic and phosphorus) is selectively introduced into a part of a surface portion of the P-type substrate region 3 including the intermediate concentration substrate region 13 by the ion implantation using the photoresist mask 55, thereby forming a high concentration N-type source region 8. At this point, the high concentration N-type source region 8 is formed so as to have a junction depth deeper than the lower face of the buried insulating film 6 (namely, the upper face of the gate electrode 5). Thus, the structure of this invention in which the high concentration N-type source region 8, the high concentration P-type substrate region 7 adjacent to the source region 8 and the intermediate concentration P-type substrate region 13 sandwiched between the substrate region 7 and the upper face portion of the low concentration N-type drain region 2 are formed on the P-type substrate region 3 is completed. In this case, the ion implantation of arsenic is performed at implantation energy of, for example, 140 keV and a dose of, for example, $4.0\times10^{15}$ ions/cm$^2$. Also, the ion implantation of phosphorus is performed at implantation energy of, for example, 190 keV and a dose of, for example, $4.0\times10^{15}$ ions/cm$^2$. For securing overlap between the gate and the source, the upper face of the gate electrode 5 is preferably placed at a level within the height of the high concentration N-type source region 8. In other words, it is necessary in this embodiment to make deep the high concentration N-type source region 8 in order to form the gate electrode 5 in the trench T excluding the upper portion thereof.

Figure 7C:
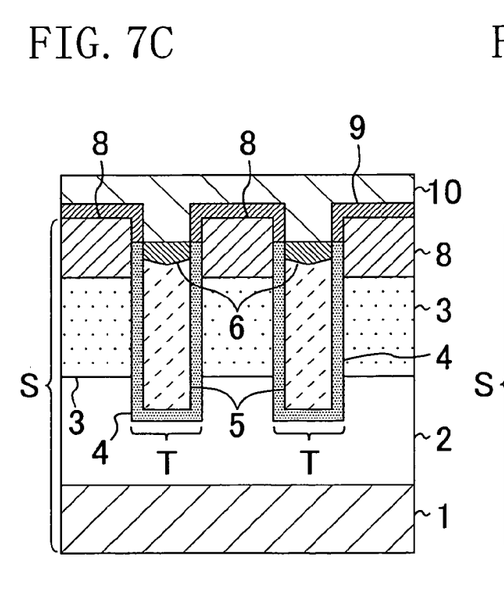
Figure 7D:
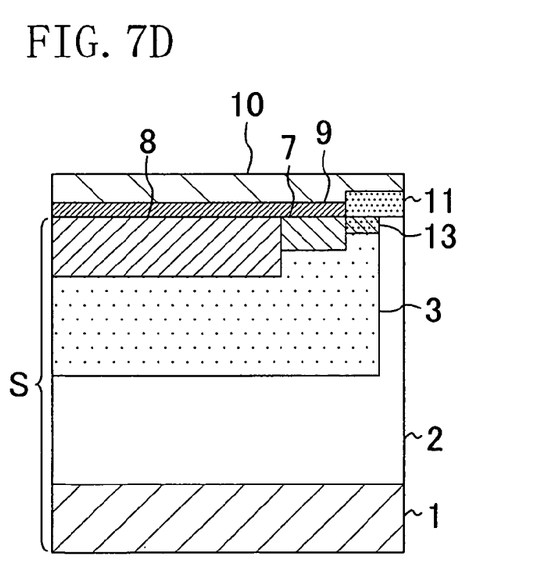

Next, a silicide layer 9 is selectively formed on the exposed face of the semiconductor substrate S, namely, on the high concentration N-type source region 8 and the high concentration P-type substrate region 7 as shown in FIGS. 7C and 7D, and then, a contact electrode 10 of, for example, an Al layer is formed so as to cover the gate electrode 5 (the buried insulating film 6) and the silicide layer 9. The contact electrode 10 is electrically connected to the high concentration N-type source region 8 and the high concentration P-type substrate region 7 through the silicide layer 9. At this point, the intermediate concentration P-type substrate region 13 and the upper face portion of the low concentration N-type drain region 2 are covered with the protection insulating film 11. Although not shown in FIGS. 7C and 7D, a barrier metal layer may be formed over the semiconductor substrate S before forming the Al layer used as the contact electrode 10.

Thereafter, although not shown in the drawings, an interlayer insulating film, a contact plug, an interconnect to be connected to the contact plug and the like are formed on the semiconductor substrate S by known technique.

In the present embodiment described so far, the following effects can be attained:

If the intermediate concentration P-type substrate region 13 of the invention is not provided in the structure of the semiconductor device of this embodiment, the P-type substrate region 3 of a low concentration is disposed between the high concentration P-type substrate region 7 for forming a source contact and the upper face portion of the low concentration N-type drain region 2. In this case, a large potential difference is caused between the high concentration P-type substrate region 7 and the upper face portion of the low concentration N-type drain region 2, and therefore, a depletion layer extending from the drain side spreads to the P-type substrate region 3 of the low concentration. As a result, it is apprehended that the drain and the substrate contact are conducted to each other. On the contrary, since the intermediate concentration P-type substrate region 13 is provided between the high concentration P-type substrate region 7 and the upper face portion of the low concentration N-type drain region 2 in this embodiment, the spread of the depletion layer from the drain region can be suppressed. Accordingly, a leakage current (conduction) between the drain and the substrate contact can be prevented, so as to improve the reliability of the semiconductor device.

Furthermore, in this embodiment, the P-type substrate region 3 (i.e., a channel region), the high concentration P-type substrate region 7 and the intermediate concentration P-type substrate region 13 are formed after the sacrificial oxide film formation of FIGS. 4C and 4D and the gate oxide film formation of FIGS. 4E and 4F. Therefore, the P-type impurity can be prevented from being excessively drawn into the oxide film in the oxidation. Accordingly, the impurity concentration in the channel region can be easily controlled, so as to attain a desired threshold voltage Vt.

Also, in this embodiment, the P-type impurity used for forming the P-type substrate region 3, the high concentration P-type substrate region 7 and the intermediate concentration P-type substrate region 13 is ion implanted into the semiconductor substrate S through the polysilicon film 5A and the protection insulating film 11, and therefore, the semiconductor device having the trench MIS gate structure can be fabricated while preventing degradation of the film quality of the gate insulating film 4 otherwise caused in the ion implantation.

In this embodiment, the semiconductor substrate S may be replaced with a single silicon substrate or an insulating substrate on which a semiconductor layer such as an epitaxial layer is formed.

Although a BPSG film is used as the buried insulating film 6 in this embodiment, another kind of insulating film can be used instead.

Furthermore, in this embodiment, after forming the polysilicon film 5A to be made into the gate electrode 5, the P-type substrate region 3 and the intermediate concentration P-type substrate region 13 are formed and then the polysilicon film 5A is etched to form the gate electrode 5. Instead, after forming the gate insulating film 4, the P-type substrate region 3 and the intermediate concentration P-type substrate region 13 may be formed before forming the polysilicon film 5A and forming the gate electrode 5.

Alternatively, the intermediate concentration P-type substrate region 13 may be formed after forming the gate electrode 5.

Moreover, the order of forming the high concentration P-type substrate region 7, the high concentration N-type source region 8 and the intermediate concentration P-type substrate region 13 is not particularly specified in this embodiment.

Although the N-channel MIS transistor is exemplified in this embodiment, the present invention is applicable to a P-channel MIS transistor, and similar effects can be attained also in this case.

Figure 8A:
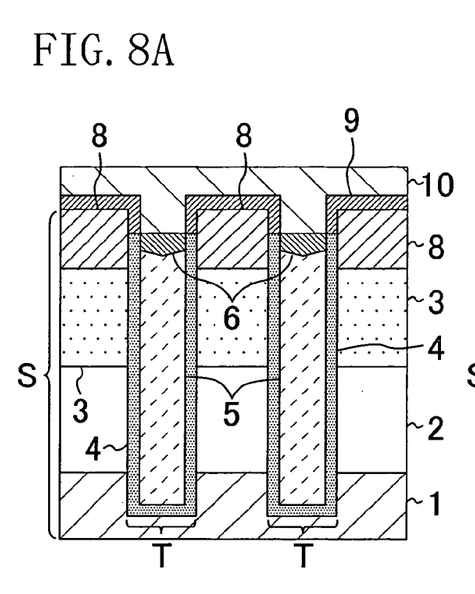
Figure 8B:
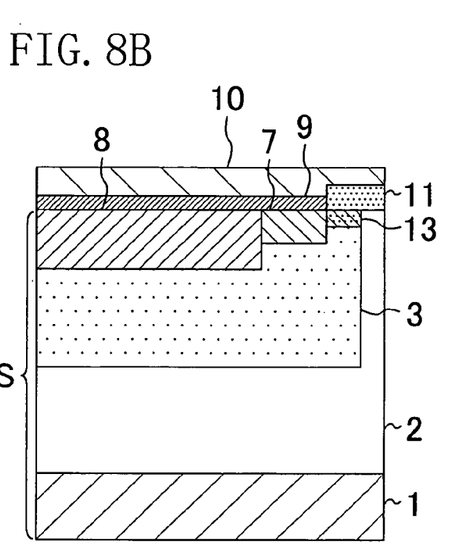

In this embodiment, the trench T is formed so as to penetrate the high concentration N-type source region 8 and the P-type substrate region 3 and reach the low concentration N-type drain region 2 in the semiconductor substrate S. Instead, for example, as shown in FIGS. 8A and 8B, the trench T may be formed to be sufficiently deep for penetrating the high concentration N-type source region 8, the P-type substrate region 3 and the low concentration N-type drain region 2 and reaching the high concentration N-type drain region 1 in the semiconductor substrate S. Also in this case, similar effects to those of this embodiment can be attained. At this point, FIG. 8A is a cross-sectional view of this modification taken from the front side of FIG. 1A and FIG. 8B is a cross-sectional view of this modification taken from the right side of FIG. 1A.

Figure 9A:
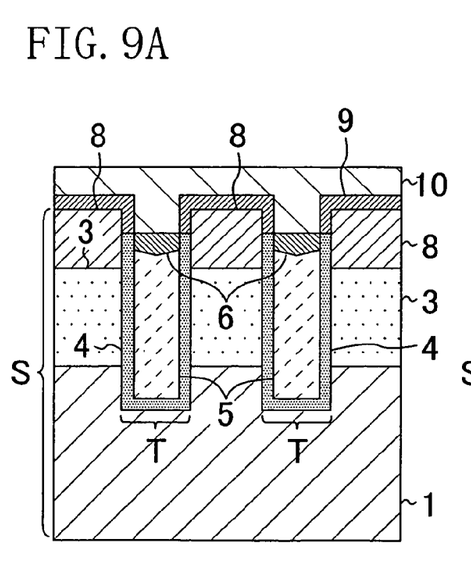
Figure 9B:
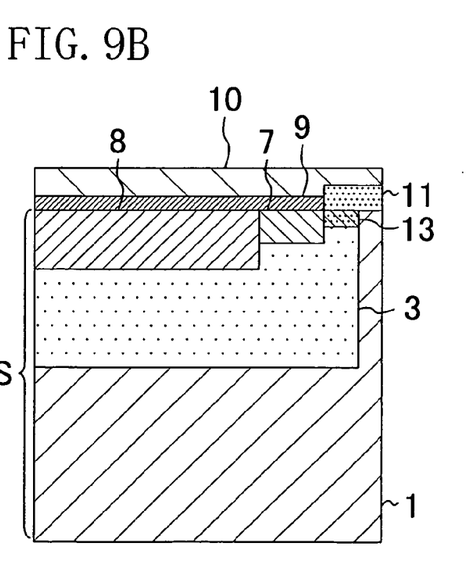

Furthermore, in this embodiment, the drain region includes the high concentration N-type drain region 1 and the low concentration N-type drain region 2 provided on the high concentration N-type drain region 1. Instead, for example, as shown in FIGS. 9A and 9B, the low concentration N-type drain region 2 may be omitted. Specifically, the P-type substrate region 3 may be formed not on the low concentration N-type drain region 2 but directly on the high concentration N-type drain region 1, and the trench T may be formed so as to penetrate through the high concentration N-type source region 8 and the P-type substrate region 3 and to reach the high concentration N-type drain region 1. Also in this case, similar effects to those of this embodiment can be attained. At this point, FIG. 9A is a cross-sectional view of this modification taken from the front side of FIG. 1A and FIG. 9B is a cross-sectional view of this modification taken from the right side of FIG. 1A.

In addition, the intermediate concentration P-type substrate region 13 is in contact with the high concentration P-type substrate region 7 and the upper face portion of the low concentration N-type drain region 2 in this embodiment. Instead, a part of the P-type substrate region 3 may be disposed between the intermediate concentration P-type substrate region 13 and the upper face portion of the low concentration N-type drain region 2.

What is claimed is:

1. A semiconductor device comprising:
    a first semiconductor region of a first conductivity type that is formed in a lower portion of a semiconductor substrate and a portion of which extends to a top face of said semiconductor substrate;
    a second semiconductor region of a second conductivity type formed on said first semiconductor region in said semiconductor substrate;
    a third semiconductor region of the first conductivity type formed on said second semiconductor region in said semiconductor substrate;
    a fourth semiconductor region of the second conductivity type formed on said second semiconductor region and adjacent to said third semiconductor region in said semiconductor substrate;
    a trench penetrating through said second semiconductor region and said third semiconductor region and reaching said first semiconductor region;
    a gate insulating film formed on an inner wall of said trench;
    a gate electrode formed on said gate insulating film within said trench; and
    a fifth semiconductor region of the second conductivity type formed on said second semiconductor region in a portion of said semiconductor substrate sandwiched between said fourth semiconductor region and a portion of said first semiconductor region positioned on a side of said fourth semiconductor region,
    wherein an upper face of the portion of said first semiconductor region extending to the top face of said semiconductor substrate, an upper face of said third semiconductor region, an upper face of said fourth semiconductor region and an upper face of said fifth semiconductor region correspond to the top face of said semiconductor substrate, and
    an impurity concentration in said fifth semiconductor region is higher than an impurity concentration in said second semiconductor region.

2. The semiconductor device of claim 1,
    wherein said fifth semiconductor region is in contact with said fourth semiconductor region.

3. The semiconductor device of claim 2,
    wherein said fifth semiconductor region is in contact with the portion of said first semiconductor region extending to the top face of said semiconductor substrate.

4. The semiconductor device of claim 1,
    wherein an impurity concentration in said fourth semiconductor region is higher than the impurity concentration in said second semiconductor region.

5. The semiconductor device of claim 1,
    wherein the impurity concentration in said fifth semiconductor region is lower than an impurity concentration in said fourth semiconductor region.

6. The semiconductor device of claim 1,
    wherein an upper face of said gate electrode is placed at a level between an upper face and a lower face of said third semiconductor region.

7. The semiconductor device of claim 1, further comprising an insulating film for covering an upper face of said gate electrode within said trench,
    wherein an upper face of said insulating film is placed at a level between an upper face and a lower face of said third semiconductor region.

8. The semiconductor device of claim 1,
    wherein said first semiconductor region includes a sixth semiconductor region of the first conductivity type including an impurity in a relatively high concentration and a seventh semiconductor region of the first conductivity type disposed on said sixth semiconductor region and including an impurity in a relatively low concentration.

9. A method for fabricating a semiconductor device comprising the steps of:
    (a) forming a first semiconductor region of a first conductivity type in a semiconductor substrate;
    (b) forming a second semiconductor region of a second conductivity type in said first semiconductor region;
    (c) forming, in an upper portion of said second semiconductor region, a third semiconductor region of the first conductivity type, a fourth semiconductor region of the second conductivity type adjacent to said third semiconductor region and a fifth semiconductor region of the second conductivity type sandwiched between said fourth semiconductor region and a portion of said first semiconductor region positioned on a side of said fourth semiconductor region;
    (d) forming a trench reaching a given portion of said first semiconductor region in said semiconductor substrate;
    (e) forming a gate insulating film on an inner wall of said trench; and
    (f) forming a gate electrode on said gate insulating film within said trench,
    wherein an impurity concentration in said fifth semiconductor region is made higher than an impurity concentration in said second semiconductor region in the step (c).

10. The method for fabricating a semiconductor device of claim 9,
    wherein an impurity concentration in said fourth semiconductor region is made higher than the impurity concentration in said second semiconductor region in the step (c).

11. The method for fabricating a semiconductor device of claim 9,
    wherein the impurity concentration in said fifth semiconductor region is made lower than an impurity concentration in said fourth semiconductor region in the step (c).

12. The method for fabricating a semiconductor device of claim 9,
wherein said gate electrode is formed to have an upper face thereof disposed between an upper face and a lower face of said third semiconductor region in the step (f).

13. The method for fabricating a semiconductor device of claim 9,
wherein said second semiconductor region and said fifth semiconductor region are formed after the step (e).

14. The method for fabricating a semiconductor device of claim 9, further comprising, between the step (d) and the step (e), a step of forming an oxide film by sacrificially oxidizing the inner wall of said trench and removing said oxide film.

15. The method for fabricating a semiconductor device of claim 9,
wherein said fifth semiconductor region is formed after the step (f).

16. The method for fabricating a semiconductor device of claim 9,
wherein the step (f) includes a sub-step (f1) of filling said trench with a conducting film and a sub-step (f2) of forming said gate electrode by etching said conducting film, and
said fifth semiconductor region is formed by introducing an impurity of the second conductivity type into said semiconductor substrate through said conducting film by ion implantation between the sub-step (f1) and the sub-step (f2).

\* \* \* \* \*